United States Patent [19]
Govaert

[11] 4,357,546
[45] Nov. 2, 1982

[54] INTEGRATED FREQUENCY DIVIDER CIRCUIT

[75] Inventor: George A. Govaert, Eindhoven, Netherlands

[73] Assignee: U.S. Philips Corporation, New York, N.Y.

[21] Appl. No.: 208,096

[22] Filed: Nov. 18, 1980

[30] Foreign Application Priority Data

Nov. 19, 1979 [NL] Netherlands ............... 7908412

[51] Int. Cl.³ ............... H03K 29/00; H03K 23/30
[52] U.S. Cl. ............... 307/225 R; 307/272 A; 307/291; 357/92
[58] Field of Search ............... 307/225 R, 220 R, 224 R, 307/272 A, 291, 299 A, 303; 357/92

[56] References Cited

U.S. PATENT DOCUMENTS 3,814,953  6/1974  Malaviya ............... 307/225 R
3,851,187 11/1974  Pao et al. ............... 307/299 A
3,912,950 10/1975  Tada ............... 307/225 R Primary Examiner—John Zazworsky
Attorney, Agent, or Firm—James J. Cannon, Jr.

[57] ABSTRACT

A frequency divider circuit realized by means of two piled bistable transistor pairs, the signal, whose frequency is to be divided, being applied in phase to the emitters of the lower transistor pair and in phase opposition to the auxiliary emitters of the upper transistor pair.

6 Claims, 4 Drawing Figures

INTEGRATED FREQUENCY DIVIDER CIRCUIT

BACKGROUND OF THE INVENTION

1. Field of the Invention

The invention relates to an integrated frequency divider circuit comprising a first and a second transistor pair, the base of the one transistor of each transistor pair being coupled to the collector of the other transistor and the collector of the one transistor being coupled to the base of the other transistor and the transistors of the second transistor pair each being provided with an emitter and an auxiliary emitter. The object of the invention is specifically to provide a divider circuit which is suitable for high signal frequencies and which is moreover of an extremely compact design, so that it can readily be integrated.

2. Description of the Prior Art

Philips Technical Review 1978/1979, No. 2, page 54 and further, devotes a comprehensive article to various types of frequency dividers suitable for high frequencies. FIG. 2 on page 56 in particular shows an example of the well-known master-slave principle. However, the circuit shown in this Figure is rather complex and therefore demands much space when integrated.

SUMMARY OF THE INVENTION

The invention provides an improvement in this respect, yielding a circuit with a reduced current comsumption, which is consequently much more economical. It is characterized in that the collector of the one transistor of the first transistor pair is coupled to the emitter of the one transistor of the second transistor pair via a first resistor, that the collector of the other transistor of the first transistor pair is coupled to the emitter of the other transistor of the second transistor pair via a second resistor, that between the collectors of the second transistor pair and a first point of fixed potential impedances are included, which impedances suitably include a third and a fourth resistor respectively, and that the auxiliary emitters of the second transistor pair are connected to a first input for applying a first signal whose frequency is to be divided.

For an optimum operation of the frequency divider circuit in accordance with the invention it is advantageous if a specific ratio between the values of the resistors is adopted. The frequency divider circuit in accordance with the invention is therefore characterized in that the first and the second resistor are of equal or substantially equal value and the value of the third and the fourth resistor is approximately $2\frac{1}{2}$ times as small as that of the first or the second resistor.

Furthermore, it is advantageous to provide the circuit with a possibility of applying a second signal to the emitters of the first transistor pair, which enables the first transistor pair to be turned on or turned off at the appropriate instants. To this end the frequency divider in accordance with the invention is further characterized in that the emitters of the first transistor pair are connected to a second input for applying a second signal, which is preferably the inverse of the first signal whose frequency is to be divided.

In order to facilitate driving of the circuit, it may further be of advantage that a drive transistor is added, which supplies two signals of opposite phase to the first and second input. To this end the frequency divider in accordance with the invention is characterized in that a first current source is included in the common-emitter line of the first transistor pair and a drive transistor is added to the circuit, whose collector is coupled to the first input, whose emitter is coupled to the second input and whose base is coupled to a third input, for applying a third signal, from which the first and the second signal are derived.

In order to improve the high-frequency behaviour it may be advantageous that the emitters of the second transistor pair receive a small auxiliary current. To this end the invention is characterized in that each of the auxiliary emitter circuits of the second transistor pair includes a second current source, which supplies a current whose value is approximately 100 times as small as the value of the current supplied by the first current source.

For realizing a frequency divider circuit with a dividend greater than 2 (for example 4) it is advantageous to arrange a plurality of circuits as defined hereinbefore above each other between the supply lines. To this end the frequency divider circuit in accordance with the invention is characterized in that a third and a fourth transistor pair are arranged and interconnected similarly to the first and the second transistor pair, the collector of the one transistor of the second transistor pair being coupled to the emitters of the third transistor pair via the emitter-collector path of a transistor operating in common-base configuration and the collector of the other transistor of the second transistor pair being coupled to the auxiliary emitters of the fourth transistor pair via the emitter-collector path of a further transistor operating in common-base configuration.

It is evident that this piling method may be extended as far as the supply voltage allows.

BRIEF DESCRIPTION OF THE DRAWINGS

The invention will now be described in more detail with reference to the drawing, in which.

DESCRIPTION OF THE PREFERRED EMBODIMENTS

Figure 1A:
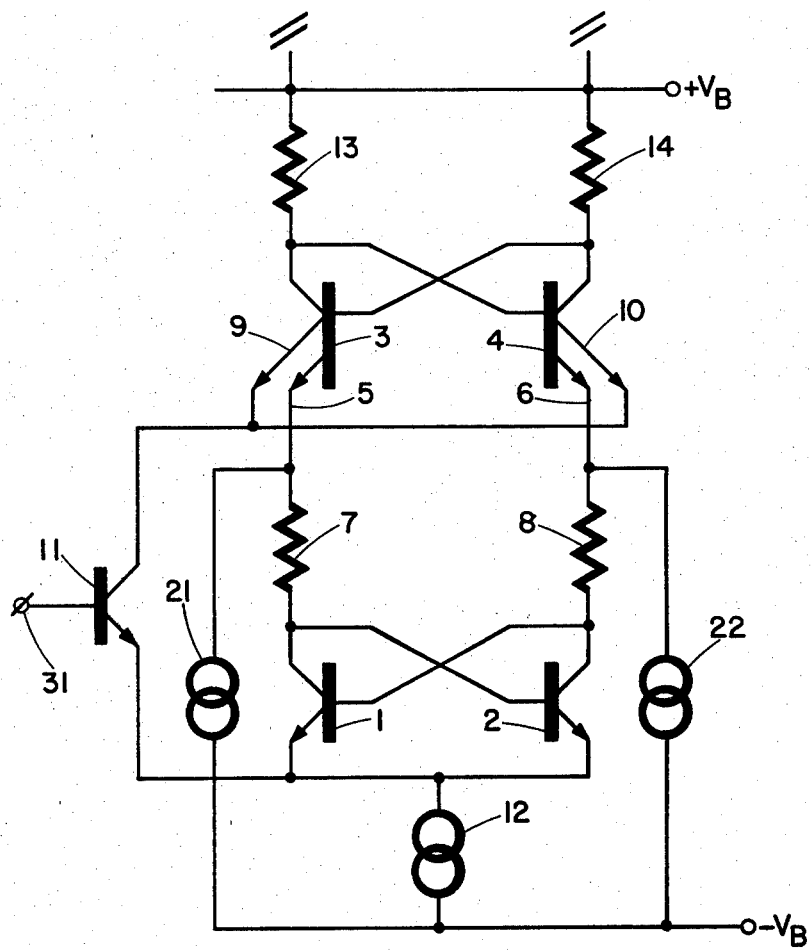
FIGS. 1A and 1B show embodiments of a circuit in accordance with the invention.
Figure 1B:
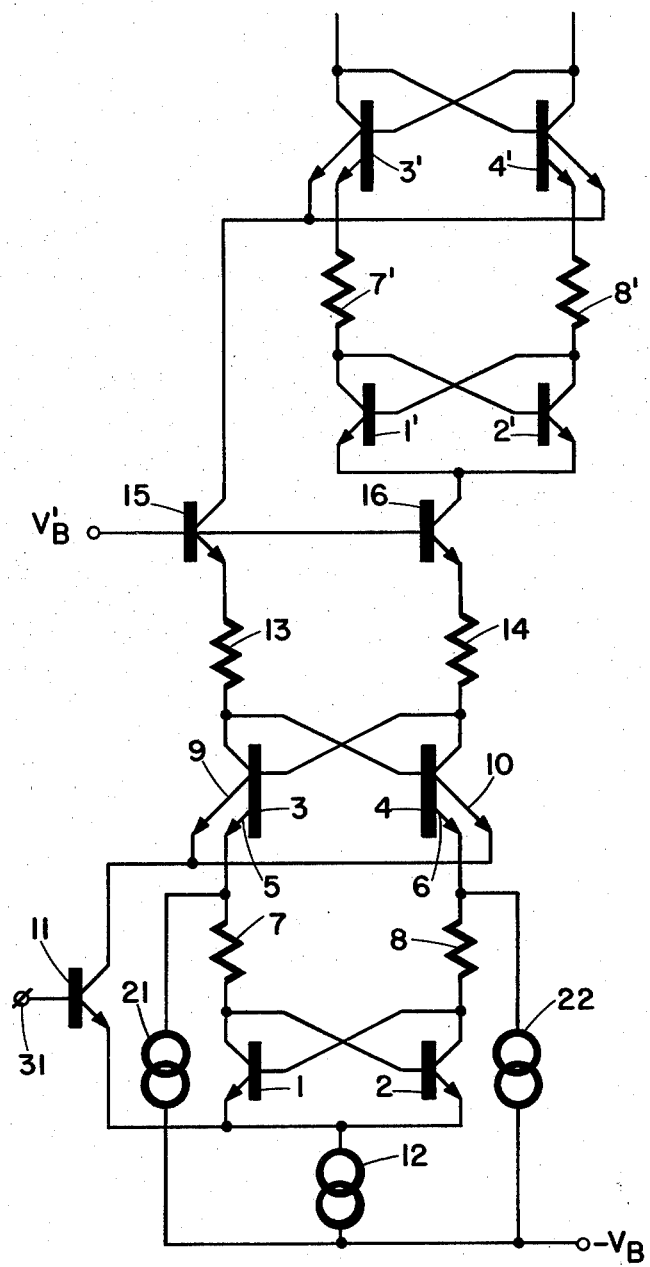

The circuit shown in FIG. 1 comprises a first pair of transistors 1 and 2, whose collectors and bases are cross-coupled to each other, so that an Eccles-Jordan flip-flop is obtained. In accordance with the invention a second pair of cross-coupled transistors 3 and 4 has its emitters 5 and 6 coupled to the respective collectors of transistors 1 and 2 via resistors 7 and 8 respectively, the signal to be divided being applied to the respective auxiliary emitters 9 and 10 of said second pair of transistors 3 and 4 via a transistor 11. The common emitter line of transistors 1 and 2 includes a current source 12 and the collector circuits of transistors 3 and 4 include resistors 13 and 14 respectively, across which resistors a signal is produced which relative to the signal appearing on input 31 is divided in frequency by a factor 2. If a higher dividend, for example 4, is to be obtained this can simply be realized by piling up. The piling up circuitry is shown in FIG. 1B which shows the same elements as shown in FIG. 1A plus additional elements. In that case resistors 13 and 14 do not lead to the power supply terminal $+V_B$, but to isolating transistors 15 and 16, whose bases are connected to a fixed voltage $V_{B'}$ the collector of the one transistor (16) being connected to the emitters of similarly cross-coupled transistors 1'-2', whose collectors are connected to the respective emitters of cross-coupled transistors 3' and 4' via resistors 7' and 8' respectively, the collector of the other isolating transistor 15 leading to the auxiliary emitters of the last-mentioned transistors 3' and 4'. For an optimum operation the values of resistors 7 and 8 should be approximately 2½ times those of the resistors 13 and 14 respectively.

The circuit of FIG. 1A operates as follows.

Assume that initially transistors 1 and 3 are conductive and that transistors 2,4 and 11 are cut off. At the instant that the signal voltage on input 31 has increased so far that transistor 11 is turned on, the current through transistor 1 decreases. The sum of the currents applied to the two emitters of transistors 3, that is the current through transistor 11, which is applied via emitter 9, and the current through transistor 1, which is applied via emitter 5, is substantially constant and equal to the total current supplied by the current source 12. Via resistor 14 the base of transistor 3 and thus the two emitters 5 and 9 are maintained at a high potential. As the current through transistor 1 decreases the voltage drop across the resistor 7 will decrease, so that the base voltage of transistor 2 will increase and this transistor will be turned on.

As the base voltage of transistor 4 is comparatively low relative to that of transistor 3, the voltage on emitter 6 will also be comparatively low, so that when transistor 2 is turned on its collector-emitter voltage, and thus the base-emitter voltage of transistor 1, rapidly becomes so low that transistor 1 is fully cut off. If subsequently transistor 11 is cut off by the input signal, transistor 3 will no longer receive any emitter current at all. Transistor 4 still receives some current via its emitter 6, because transistor 2 conducts. As a result of this, the voltage drop across resistor 14 becomes larger than that across resistor 13, so that transistor 3 is turned off and transistor 4 is turned on completely. Thus, transistors 2 and 4 are now conductive and transistors 1 and 3 are cut off.

Owing to the symmetry of the circuit the next input signal pulse, which temporarily turns on transistor 11, will initiate a sequence similar to that just described. However, transistors 1 and 3 now change from the cut off to the conductive state and transistors 2 and 4 from the conductive to the cut-off state, thereby completing a full dividing cycle. In a similar way the transistors 15 or 16 conduct alternately, so that current is applied either to one of the auxiliary emitters of transistor 3 and 4 respectively, the signal whose frequency has been divided by a factor 4 being available on the collectors of these transistors. This piling-up process may be repeated several times.

By connecting the emitters 5 and 6 of transistors 3 and 4 to the power supply terminal $-V_B$ via current sources 21 and 22 respectively, which are set to approximately 0.01 times the current of the current source 12, the high-frequency behaviour may be further improved.

Figure 2:
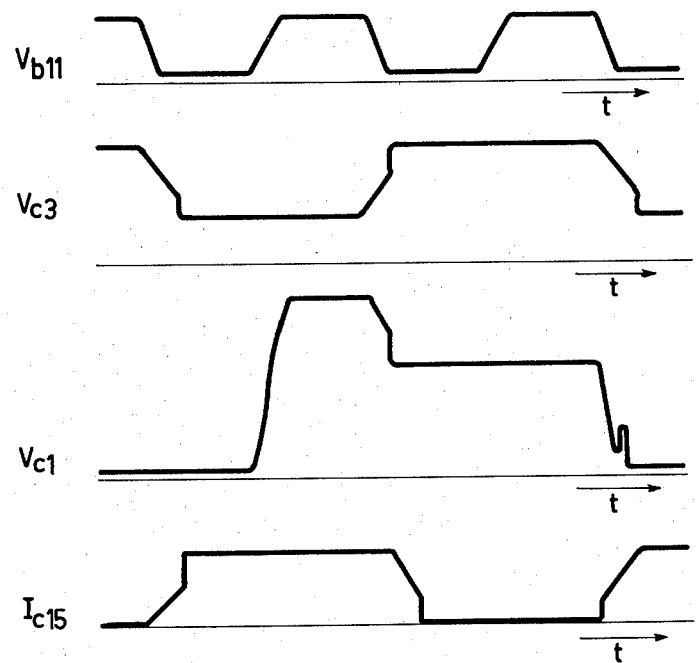
FIG. 2 shows voltage-time diagrams to illustrate the operation of the circuit of FIG. 1A.

FIG. 2 represents the voltages on the various relevant points in the circuit arrangement of FIG. 1B as a function of time, $V_{b11}$ representing the signal voltage, whose frequency is to be divided, on the base of transistor 11, $V_{c3}$ the voltage on the collector of transistor 3, and $V_{c1}$ that on the collector of transistor 1. Finally, $I_{c15}$ represents the current through transistor 15 in the case that a higher dividing factor is required.

Figure 3:
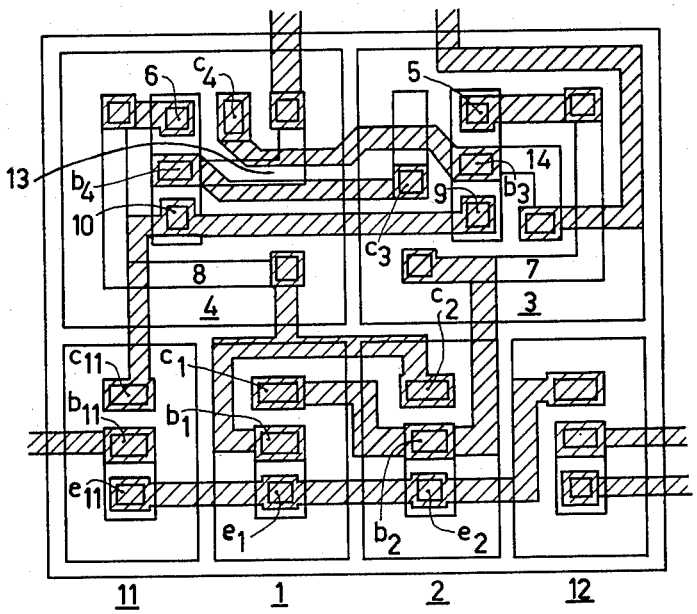
FIG. 3 shows a lay-out of such the circuit of FIG. 1A after integration.

FIG. 3 is a plan view of a semiconductor body in which the various components of FIG. 1B are integrated. The reference numerals correspond to those used in FIG. 1B, the letters e, b and c respectively denoting the emitter, base and collector of the relevant transistor (except for the emitters 6, 10, 5 and 9). It will be evident that owing to the extremely compact circuit arrangement this lay-out can also be highly compact.

What is claimed is:

1. A frequency divider circuit comprising a first and a second transistor pair, the base of the one transistor of each transistor pair being coupled to the collector of the other transistor and the collector of the one transistor being coupled to the base of the other transistor and the transistors of the second transistor pair each being provided with an emitter and an auxiliary emitter, characterized in that the collector of the one transistor of the first transistor pair is coupled to the emitter of the one transistor of the second transistor pair via a first resistor, that the collector of the other transistor of the first transistor pair is coupled to the emitter of the other transistor of the second transistor pair via a second resistor, that between the collectors of the second transistor pair and a first point of fixed potential impedances are included, which impedances suitably include a third and a fourth resistor respectively, and that the auxiliary emitters of the second transistor pair are connected to a first input for applying a first signal whose frequency is to be divided.

2. A frequency divider circuit as claimed in claim 1, characterized in that the first and the second resistor are of equal or substantially equal value and the value of the third and the fourth resistor is approximately 2½ times as small as that of the first or the second resistor.

3. A frequency divider circuit as claimed in claim 1 or 2, characterized in that the emitters of the first transistor pair are connected to a second input for applying a second signal, which is suitably the inverse of the first signal whose frequency is to be divided.

4. A frequency divider circuit as claimed in claim 3, characterized in that a first current source is included in a common-emitter line of the first transistor pair and a driver transistor is added to the circuit, whose collector is coupled to the first input, whose emitter is coupled to the second input and whose base is coupled to a third input, for applying a third signal, from which the first and the second signal are derived.

5. A frequency divider circuit as claimed in claim 1, characterized in that a third and a fourth transistor pair are arranged and interconnected similarly to the first and the second transistor pair, the collector of the one transistor of the second transistor pair being coupled to the emitters of the third transistor pair via the emitter-collector path of a transistor in common-base configuration and the collector of the other transistor of the second transistor pair being coupled to the auxiliary emitters of the fourth transistor pair via the emitter-collector path of a further transistor in common-base configuration.

6. A frequency divider circuit as claimed in claim 4, characterized in that between each of the auxiliary emitters of the second transistor pair and a point of fixed potential there is included a second current source, which supplies a current whose value is approximately 100 times as small as the value of the current suppled by the first current source.

* * * * *